(12) United States Patent
Tian et al.

(10) Patent No.: US 11,244,969 B2
(45) Date of Patent: Feb. 8, 2022

(54) ARRAY SUBSTRATE AND MANUFACTURING METHOD THEREOF, DISPLAY SUBSTRATE, AND DISPLAY DEVICE

(71) Applicant: BOE Technology Group Co., Ltd., Beijing (CN)

(72) Inventors: Xueyan Tian, Beijing (CN); Zheng Liu, Beijing (CN); Shuai Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/509,548

(22) Filed: Jul. 12, 2019

(65) Prior Publication Data

US 2020/0027903 A1 Jan. 23, 2020

(30) Foreign Application Priority Data

Jul. 20, 2018 (CN) .......................... 201810802486.9

(51) Int. Cl.
*H01L 27/12* (2006.01)
*H01L 27/32* (2006.01)
(Continued)

(52) U.S. Cl.
CPC ...... *H01L 27/1244* (2013.01); *H01L 23/4985* (2013.01); *H01L 27/1218* (2013.01);
(Continued)

(58) Field of Classification Search
None
See application file for complete search history.

(56) References Cited

U.S. PATENT DOCUMENTS

| 2016/0181287 A1* | 6/2016 | Li | ........................ H01L 51/0097 257/72 |
| 2017/0194411 A1* | 7/2017 | Park | .................... H01L 51/5259 |

(Continued)

FOREIGN PATENT DOCUMENTS

| CN | 103594024 A | 2/2014 |
| CN | 104091891 A | 10/2014 |

(Continued)

OTHER PUBLICATIONS

First office action of Chinese application No. 201810802486.9 dated Apr. 2, 2020.

*Primary Examiner* — Steven B Gauthier
(74) *Attorney, Agent, or Firm* — Fay Sharpe LLP

(57) ABSTRACT

The present disclosure discloses an array substrate, a manufacturing method thereof, a display substrate, and a display device, belonging to the technical field of display. The array substrate includes: a flexible base, and, a TFT and a connecting line which are on a side of the flexible base. The array substrate has a display area and a lead area. The TFT is in the display area. The connecting line is in the lead area. The connecting line is used to electrically connect the TFT to a drive circuit. A manufacturing material of the connecting line includes a flexible conductive material. Since the material forming the connecting line includes a flexible conductive material, and the flexible conductive material has electrical conductivity and is not easily broken, the breaking probability of the connecting line is reduced, and the yield of the display device is effectively improved.

16 Claims, 6 Drawing Sheets

(51) Int. Cl.
  *H01L 23/498* (2006.01)
  *H01L 51/00* (2006.01)
  *H01L 51/56* (2006.01)

(52) U.S. Cl.
  CPC ...... *H01L 27/1248* (2013.01); *H01L 27/1259* (2013.01); *H01L 27/3276* (2013.01); *H01L 51/0097* (2013.01); *H01L 51/56* (2013.01)

(56) References Cited

U.S. PATENT DOCUMENTS

2018/0083211 A1     3/2018   Lee et al.
2018/0337223 A1*   11/2018   Lee .................... H01L 27/3276
2020/0091197 A1     3/2020   Li et al.

FOREIGN PATENT DOCUMENTS

| CN | 107833906 A | 3/2018 |
| CN | 108091612 A | 5/2018 |
| CN | 108172122 A | 6/2018 |
| CN | 108288621 A | 7/2018 |

\* cited by examiner

ARRAY SUBSTRATE AND MANUFACTURING METHOD THEREOF, DISPLAY SUBSTRATE, AND DISPLAY DEVICE

CROSS-REFERENCE TO RELATED APPLICATION

This application claims priority to Chinese Patent Application No. 201810802486.9, filed on Jul. 20, 2018 and entitled "Array substrate and manufacturing method thereof, and display device", the entire contents of which are incorporated herein by reference.

TECHNICAL FIELD

The present disclosure relates to the field of display technology, and particularly relates to an array substrate and a manufacturing method thereof, a display substrate and a display device.

BACKGROUND

In order to improve the comfort of the user using a display device, the screen size of the display device is getting larger and larger, and accordingly, the overall size of the display device also becomes larger as the screen size becomes larger. However, if the overall size of the display device is too large, the user's use effect and visual effect may be affected. Therefore, it is necessary to reduce the frame around the screen so that the overall size of the display device is not too large.

SUMMARY

The present provides an array substrate and a manufacturing method thereof, a display substrate and a display device. The technical solutions are as follows.

In an aspect, an array substrate is provided, and the array substrate comprises: a flexible base, and, a thin film transistor (TFT) and a connecting line which are on a side of the flexible base, wherein the array substrate has a display area and a lead area, the TFT is in the display area, the connecting line is in the lead area, the connecting line is used to electrically connect the TFT to a drive circuit, and a manufacturing material of the connecting line comprises a flexible conductive material.

Optionally, the flexible conductive material is one of a carbon nanotube material and a carbon nanotube material doped with a metal material.

Optionally, the array substrate further comprises: an inorganic conductive material layer, wherein the connecting line is on a side of the inorganic conductive material layer away from the flexible base.

Optionally, the array substrate further comprises: an inorganic material layer having a via hole in the lead area, wherein an overlap exists between an orthographic projection of the connecting line on the flexible base and an orthographic projection of the via hole on the flexible base, and the array substrate is configured to be capable of being bent where the via hole is.

Optionally, the inorganic material layer has at least one via hole column in the lead area, each of the at least one via hole column comprises a plurality of via holes, and an arrangement direction of the via holes in each of the at least one via hole column is parallel to a bending line which appears when the array substrate is bent.

Optionally, any two adjacent via holes of each of the at least one via hole columns are connected to each other.

Optionally, an orthographic projection of any of the connecting lines on the flexible base covers orthographic projections of at least two via holes of a via hole column on the flexible base.

Optionally, the via hole have a shape of one of elliptical, hexagonal, and diamond.

Optionally, the array substrate further comprises: an inorganic conductive material layer, wherein the connecting line is on a side of the inorganic conductive material layer away from the flexible base, and the inorganic material layer comprises the inorganic conductive material layer.

Optionally, the via hole is filled with an organic filling.

Optionally, the connecting line is on a side of the organic filling away from the flexible base.

Optionally, the array substrate further comprises: an inorganic conductive material layer, wherein the inorganic material layer comprises the inorganic conductive material layer, and the connecting line is between the organic filling and the inorganic conductive material layer.

Optionally, the array substrate further comprises: a drive circuit, wherein when the array substrate is in a bent state, the connecting line is outside a bent portion of the flexible base, and the drive circuit and the TFT are respectively on opposite sides of the flexible base which is in a bent state.

In another aspect, a method for manufacturing an array substrate is provided, and the method comprises:

defining a display area and a lead area on a side of a flexible base;

forming a thin film transistor (TFT) in the display area on a side of the flexible base; and forming a connecting line in the lead area on a side of the flexible base, wherein the connecting line is used to electrically connect the TFT to a drive circuit, and a manufacturing material of the connecting line comprises a flexible conductive material.

Optionally, before forming a connecting line in the lead area on a side of the flexible base, the method further comprises:

forming an inorganic conductive material layer on the flexible base, wherein the inorganic conductive material layer has a via hole in the lead area, an overlap exists between an orthographic projection of the connecting line on the flexible base and an orthographic projection of the via hole on the flexible base, and the array substrate is configured to be capable of being bent where the via hole is;

forming a connecting line in the lead area on a side of the flexible base comprises:

forming the connecting line on the flexible base on which the inorganic conductive material layer is formed; and after forming a connecting line in the lead area on a side of the flexible base, the method further comprises:

filling an organic filling in the via hole on the flexible base on which the connecting line is formed.

Optionally, before forming a connecting line in the lead area on a side of the flexible base, the method further comprises:

forming an inorganic conductive material layer on the flexible base, wherein the inorganic conductive material layer has a via hole in the lead area, an overlap exists between an orthographic projection of the connecting line on the flexible base and an orthographic projection of the via hole on the flexible base, and the array substrate is used to be capable of being bent where the via hole is; and filling the via hole with an organic filling; and forming a connecting line in the lead area on a side of the flexible base comprises:

forming the connecting line on a side of the organic filling away from the flexible base.

Optionally, forming a connecting line in the lead area on a side of the flexible base comprises:

forming a carbon nanotube film in the lead area on a side of the flexible base;

baking the flexible base on which the carbon nanotube film is formed; and patterning the carbon nanotube film after baking to form the connecting line.

In still another aspect, display substrate is provided, and the display substrate comprises: an array substrate, a flexible base, and, a thin film transistor (TFT) and a connecting line which are on a side of the flexible base, wherein the array substrate has a display area and a lead area, the TFT is in the display area, the connecting line is in the lead area, the connecting line is used to electrically connect the TFT to a drive circuit, and a manufacturing material of the connecting line comprises a flexible conductive material.

Optionally, the display substrate further comprises: a first electrode layer, a pixel defining layer, an organic light-emitting layer and a second electrode layer which are sequentially superposed on the TFT, wherein one of a source and a drain of the TFT is connected to the first electrode layer.

In yet still another aspect, a display device is provided, and the display device comprises the display substrate according to the present disclosure.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

Embodiments of the present disclosure will be described in further detail with reference to the accompanying drawings, to present the principles and advantages of the present disclosure more clearly.

Figure 1:
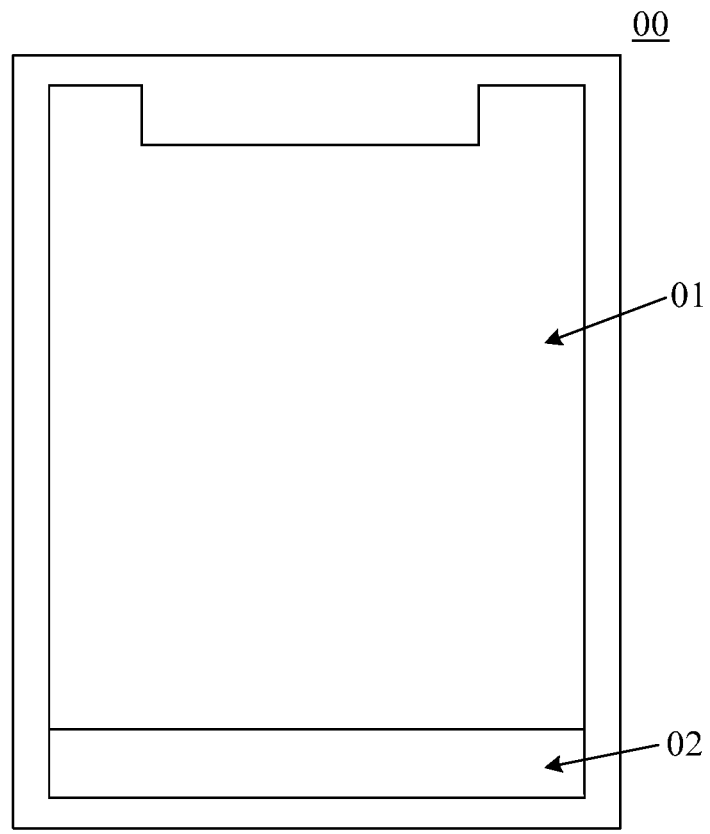
FIG. 1 is a schematic structural diagram of an array substrate provided in a display device according to an embodiment of the present disclosure.

FIG. 1 is a schematic structural diagram of an array substrate in a display device according to an embodiment of the present disclosure. Please refer to FIG. 1. An array substrate 00 has a display area 01 and a lead area 02. A plurality of signal lines (not shown in FIG. 1) are in the display area 01. A plurality of connecting lines (not shown in FIG. 1) connected to the plurality of signal lines in a one-to-one correspondence is in the lead area 02, and the plurality of signal lines is used to connect the signal lines to a drive chip. For example, the plurality of signal lines disposed in the display area 01 may include a plurality of gate lines and a plurality of data lines. The drive chip may include a gate driver and a source driver. The gate driver and the plurality of gates may be connected and the source driver and the plurality of data lines may be connected through the plurality of connecting lines. The gate driver may provide a gate drive signal for the plurality of gate lines. The source driver may provide a source drive signal for the plurality of data lines.

Figure 2:
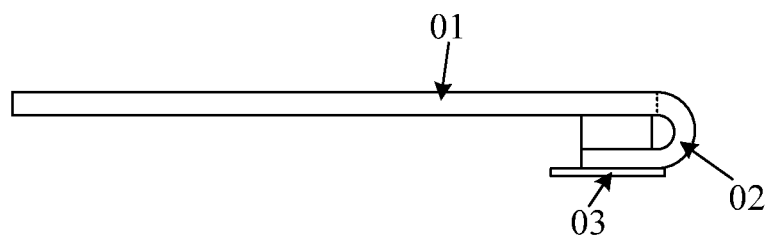
FIG. 2 is a schematic structural diagram of a display device according to an embodiment of the present disclosure.

In order to reduce the frame of the display device, the drive chip is usually on the back of the display panel, and the connecting lines in the lead area 02 are bent, so that the drive chip is connected to the corresponding signal lines through the bent connecting lines. Please refer to FIG. 2. FIG. 2 is a schematic structural diagram of a display device according to an embodiment of the present disclosure. When the array substrate is in a bent state, the array substrate is bent in the lead area 02. At this time, the connecting lines can be bent to a side of the array substrate 00 away from the light-emitting side, so that the drive chip 03 can be on a side of the array substrate away from the light-emitting side, and it is not necessary to dispose the driver chip in the frame area of the light-emitting side of the array substrate. Then, the frame of the display device can no longer shield the drive chip 03, which can reduce the width of the frame of the display device and is advantageous for narrowing the frame of the display device.

As known to the inventors, the plurality of connecting lines in the lead area 01 is made of a metal material. When a connecting line is bent, the connecting line is easily broken, resulting in a lower yield of the display device. Moreover, when the metal material is bent a plurality of times, the electrical resistivity of the connecting line is also affected by the influence of the material property of the metal material, which further reduces the yield of the display device.

Figure 3:
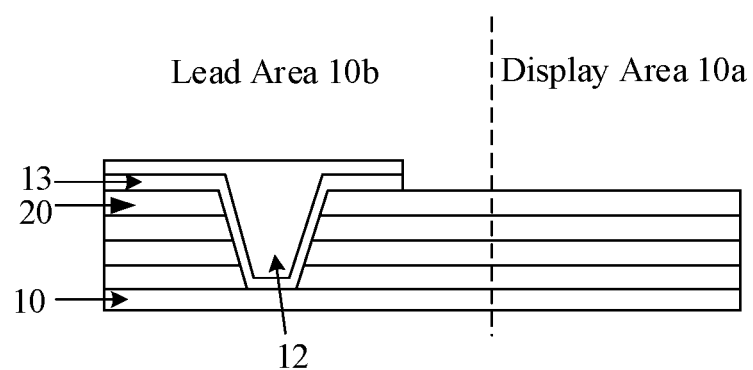
FIG. 3 is a schematic structural diagram of an array substrate according to an embodiment of the present disclosure.

Please refer to FIG. 3. FIG. 3 is a schematic structural diagram of an array substrate according to an embodiment of the present disclosure. The array substrate may include: a flexible base 10, and a thin film transistor (TFT) (not shown in FIG. 3) and a connecting line 13 which are on a side of the flexible base 10.

The array substrate has a display area 10a and a lead area 10b. The TFT is in the display area 10a. The connecting line 13 is in the lead area 10b. The connecting line 13 is used to electrically connect the TFT in the display area 10a to a drive circuit. A manufacturing material of the connecting line 13 includes a flexible conductive material.

Exemplarily, the flexible conductive material is a carbon nanotube material or a flexible metal material. Alternatively, the flexible conductive material may be a carbon nanotube material doped with a metal material. When a connecting line is made of a carbon nanotube material doped with a metal material, the electrical resistivity of the connecting line can be ensured, thereby ensuring the electrical characteristics of the connecting line.

In summary, the array substrate provided by the embodiment of the present disclosure includes a flexible base. A TFT is disposed on a display area of the flexible base, a connecting line electrically connected to the TFT is disposed in a lead area of the flexible base, and a manufacturing material of the connecting line includes a flexible conductive material. Since the flexible conductive material has electrical conductivity and is not easily broken, the connecting line is not easily broken when the array substrate is bent. Compared with the related art, the breaking probability of the connecting line is reduced, which effectively improves the yield of the display device. Moreover, when the connecting line is bent a plurality of times, since the resistivity of the flexible conductive material is not affected, the resistivity of the connecting line will not be affected either, which may further improve the yield of the display device.

The array substrate further includes a drive circuit. When the array substrate is in a bent state, the connecting line 13 may be outside a bent portion of the flexible base 10, and the drive circuit and the TFT are respectively on opposite sides of the flexible base 10 which is in a bent state. The drive circuit can be integrated in the driver chip.

Optionally, the array substrate may further include an inorganic conductive material layer 20. The connecting line 13 is on a side of the inorganic conductive material layer 20 away from the flexible base 10. That is, the connecting line 13 is in contact with the surface of the inorganic conductive material layer 20 away from the flexible base 10, which can be considered that the connecting line 13 is connected in parallel with the inorganic conductive material layer 20, so that the resistance of the wires can be reduced after parallel connection, thereby ensuring the electrical performance of the connecting line 13. The inorganic conductive material layer 20 may be composed of three sub-film layers which are arranged in a stack. The three sub-film layers are respectively a first sub-film layer made of titanium (i.e., a Ti film), a second sub-film layer made of aluminum (i.e., an Al film) and a third sub-film layer made of titanium (i.e., a Ti film).

Moreover, the array substrate may further include other film layers made of an inorganic material. For convenience of description, the other film layers made of an inorganic material and the inorganic conductive material layer are collectively referred to as an inorganic material layer. Moreover, in order to ensure that the inorganic conductive material layer is in contact with the connecting line 13, the inorganic conductive material layer should be the film layer in the inorganic material layer which is the farthest from the flexible base.

The inorganic material layer may be provided with a via hole in the lead area 10b. An overlap exists between an orthogonal projection of the connecting line 13 on the flexible base 10 and an orthographic projection of the via hole on the flexible base 10. The array substrate is used to be capable of being bent where the via hole is. The via hole penetrates through the inorganic material layer.

When the inorganic material layer made of at least one inorganic material is bent, the stress generated by the inorganic material layer under the action of a bending force is large, which makes it difficult to bend the array substrate. Moreover, when a large bending force is adopted to bend the array substrate, the connecting line 13 is easily broken. Therefore, when the inorganic material layer is provided with a via hole in the lead area 10b, if the array substrate is bent where the via hole is, the stress generated by the bending force can be reduced, which on the one hand may facilitate the bending of the array substrate and on the other hand may reduce the breaking probability of the connecting line 13.

Further, in order to ensure the flatness of the array substrate, the via hole may be filled with an organic filling 12 made of an organic material. Since the stress generated by the organic material under the bending force is relatively small when the organic material is bent, it may facilitate the bending of the array substrate and reduce the breaking probability of the connecting line 13.

When the via hole is filled with the organic filling 12, the connecting line can be arranged in various ways. The embodiments of the present disclosure are schematically described by taking the following two implementations as examples.

Figure 4:
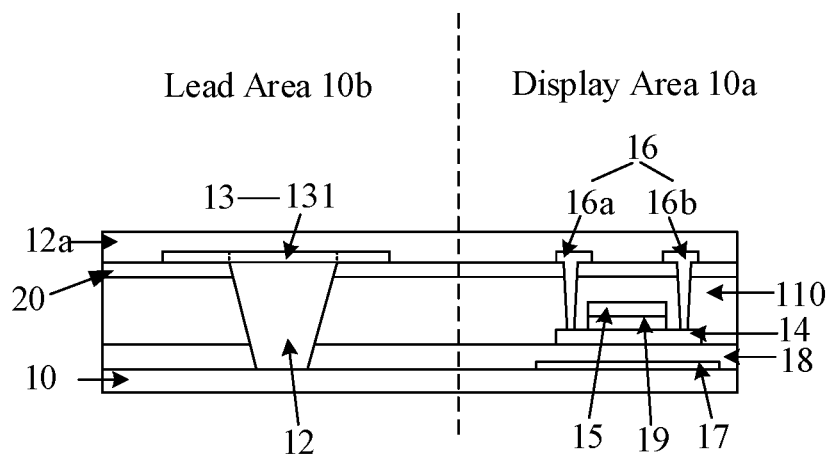
FIG. 4 is a schematic structural diagram of another array substrate according to an embodiment of the present disclosure.

In the first implementation, please refer to FIG. 4. FIG. 4 is a schematic structural diagram of another array substrate according to an embodiment of the present disclosure. The connecting line 13 is on a side of the organic filling 12 away from the flexible base 10. At this time, after the via hole is formed in the inorganic material layer, the via hole may be filled with the organic filling 12, and then the connecting line 13 may be formed on the organic filling 12.

Figure 5:
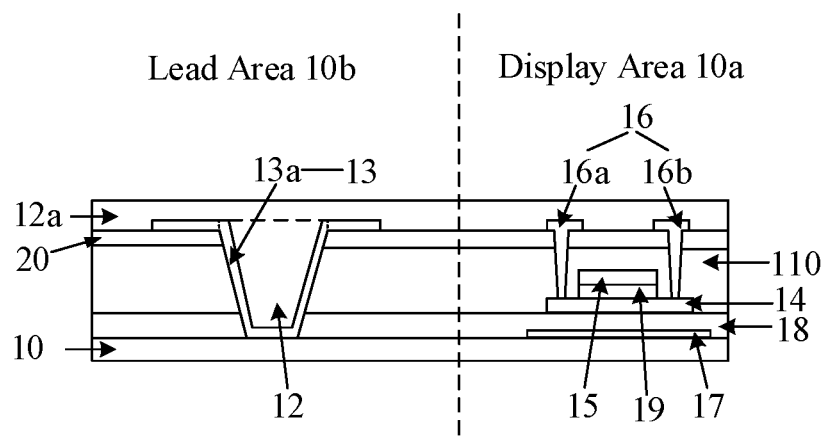
FIG. 5 is a schematic structural diagram of still another array substrate according to an embodiment of the present disclosure.

In the second implementation, please refer to FIG. 5. FIG. 5 is a schematic structural diagram of still another array substrate according to an embodiment of the present disclosure. The connecting line 13 may be between the organic filling 12 and the inorganic conductive material layer 20. Partial wiring 13a in the connecting line 13 is in the via hole. At this time, after the via hole is formed in the inorganic material layer, the connecting line 13 may be formed and the partial wiring 13a of the connecting line 13 is in the via hole, and then the via hole in which the partial wiring 13a is may be filled with the organic filling 12.

In the embodiment of the present disclosure, please refer to FIG. 4 and FIG. 5. The array substrate may further include a planarization layer 12a. The material of which the planarization layer 12a is made may be the same as the material of which the organic filling 12 is made. In the second implementation described above, the connecting line 13 is between the organic filling 12 and the inorganic conductive material layer, so the organic filling 12 can be formed simultaneously with the planarization layer 12a. For example, the organic filling 12 may be formed in a one-time patterning process with the planarization layer 12a, and the organic filling 12 may be integral with the planarization layer 12a.

Please refer to FIG. 4 and FIG. 5. The TFT in the display area 10a may include an active layer pattern 14, a gate pattern 15, and a source-drain pattern 16. A gate insulating layer 19 is between the active layer pattern 14 and the gate pattern 15. When the TFT is a top gate type TFT, the array substrate may further include a light-shielding layer 17 and a buffer layer 18, and an interlayer dielectric layer 110 between the gate pattern 15 and the source-drain pattern 16. The source-drain pattern 16 includes a source 16a, a drain 16b, gate lines (not shown in FIGS. 4 and 5), and data lines (not shown in FIGS. 4 and 5). At this time, the inorganic material layer may further include film layers such as a buffer layer 18 and an interlayer dielectric layer 110.

In order to simplify the manufacturing process of the array substrate, the connecting line 13 in the lead area 10*b* and the source-drain pattern 16 of the TFT in the display area 10*a* may be in the same layer. That is, the connecting line 13 and the source-drain pattern 16 can be formed in the one-time patterning process. At this time, the material of which the source-drain pattern 16 is made also includes a flexible conductive material. Exemplarily, the flexible conductive material may be a carbon nanotube material or a flexible metal material. Moreover, when the flexible conductive material is a carbon nanotube material, in order to improve the electrical properties of the signal lines (i.e., gate lines or data lines) in the connecting line 13 and the source-drain pattern 16, a non-flexible metal material may be added to the carbon nanotube material. At this time, the materials for forming the source-drain pattern and the connecting line both include a carbon nanotube material and a non-flexible metal material. It should be noted that FIG. 4 and FIG. 5 are schematic diagrams illustrating that the TFT in the display area is a top gate type TFT. In an optional implementation, the TFT in the display area may also be a bottom gate type TFT, which will not be described in detail in the embodiment of the present disclosure.

Alternatively, when the array substrate includes an inorganic conductive material layer, the inorganic conductive material layer may be in the same layer as the source-drain pattern of the TFT to simplify the manufacturing process of the array substrate.

In an embodiment of the present disclosure, the process of forming the inorganic conductive material layer and the connecting line may include: at first forming a layer of metal material on the flexible base, forming a via hole in the lead area 10*b* on the flexible base formed with a layer of metal material to obtain an inorganic conductive material layer having a via hole, forming a carbon nanotube material on the metal material in which the via hole is formed, and performing corresponding treatment so that the carbon nanotube material is combined with the previously formed metal material to achieve the effect of connecting the connecting lines in parallel with the inorganic conductive material layer.

Optionally, the manufacturing material of the flexible base 10 may be polyimide (PI). Since PI has good ductility, manufacturing a flexible base using PI may improve the bending effect of the connecting lines in the lead area 10*b*.

Figure 6:
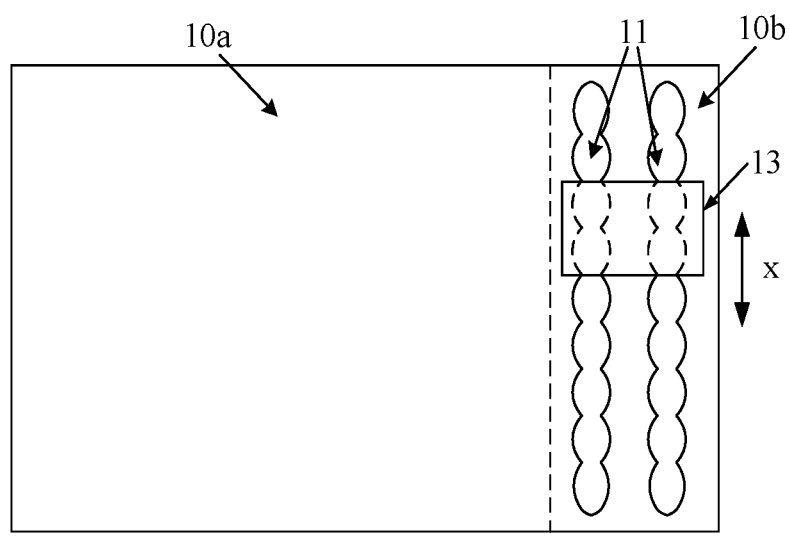
FIG. 6 is a top plan view of an array substrate according to an embodiment of the present disclosure.

FIG. 6 is a top plan view of an array substrate according to an embodiment of the present disclosure. Please refer to FIG. 6. A plurality of via holes 11 is in the lead area 10*b*. The plurality of via holes 11 may be divided into at least one via hole column. Each via hole column includes a plurality of via holes 11. An arrangement direction of the via holes 11 in each via hole column is parallel to the bending line which appears when the array substrate is bent. The bending line is an axis along which the array substrate bends when bending occurs. Normally, the bending line which appears when the array substrate is bent is parallel to a width direction x of the array substrate, and therefore the arrangement direction of the plurality of via holes 11 in each via hole column is also parallel to the width direction x of the array substrate.

Optionally, any adjacent two via holes 11 in each via hole column may be connected to each other. That is, the plurality of via holes 11 in each via hole column is continuously arranged. Compared with the discrete arrangement of the via holes 11 in each via hole column, the manner of forming the continuously arranged via holes 11 in the lead area is relatively simple, and by this the bending difficulty of the array substrate may be further reduced.

In an implementation, there is a plurality of connecting lines in the lead area 10*b*. An orthographic projection of each connecting line on the flexible base may cover orthographic projections of at least two via holes in any of the via hole columns 11 on the flexible base.

Figure 7:
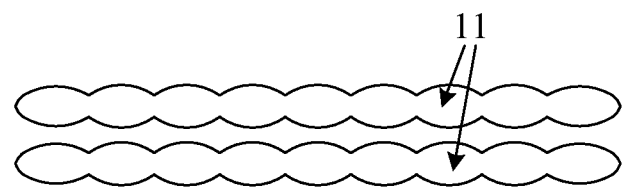
FIG. 7 is a schematic structural diagram of a via hole according to an embodiment of the present disclosure.
Figure 8:
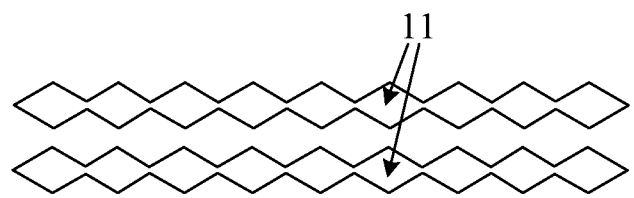
FIG. 8 is a top plan view of another array substrate according to an embodiment of the present disclosure.
Figure 9:
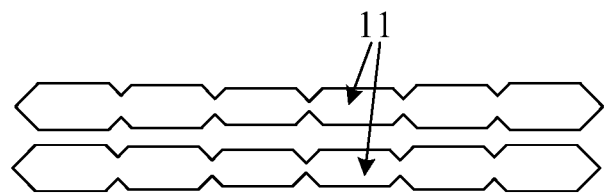
FIG. 9 is a top plan view of still another array substrate according to an embodiment of the present disclosure.

Further, in order to reduce stress applied to the connecting line in the lead area, t the via hole 11 may have a shape of ellipse, hexagon, or diamond. For example, as shown in FIG. 7, each via hole 11 in the lead area has a shape of elliptical. As shown in FIG. 8, each via hole 11 in the lead area has a shape of diamond. As shown in FIG. 9, each via hole 11 in the lead area has a shape of hexagonal. If the via hole 11 in the lead area has a shape of elliptical, hexagonal or rhombic, when the lead area is bent, the stress applied to the via hole 11 in the lead area is small, which may further reduce the bending difficulty of the array the substrate to further reduce the breaking probability of the connecting line.

In summary, the array substrate provided by the embodiment of the present disclosure includes a flexible base. A TFT is disposed on a display area of the flexible base, a connecting line electrically connected to the TFT is disposed in a lead area of the flexible base, and a manufacturing material of the connecting line includes a flexible conductive material. Since the flexible conductive material has electrical conductivity and is not easily broken, the connecting line is not easily broken when the array substrate is bent. Compared with the related art, the breaking probability of the connecting line is reduced, which effectively improves the yield of the display device. Moreover, when the connecting line is bent a plurality of times, since the resistivity of the flexible conductive material is not affected, the resistivity of the connecting line will not be affected either, which may further improve the yield of the display device.

Figure 10:
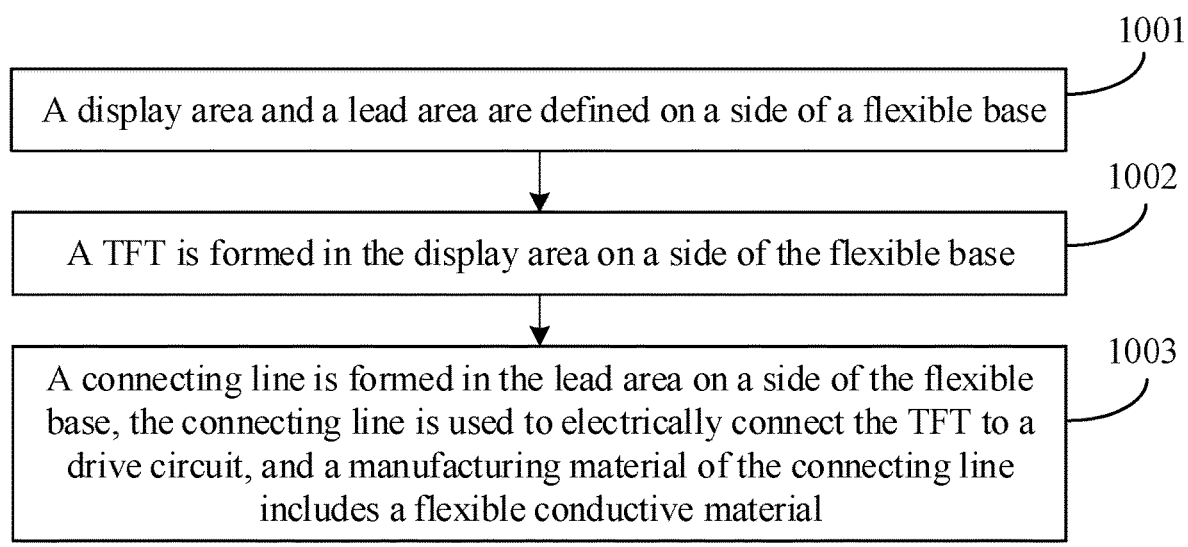
FIG. 10 is a flowchart of a method for manufacturing an array substrate according to an embodiment of the present disclosure.

Please refer to FIG. 10. FIG. 10 is a flowchart of a method for manufacturing an array substrate according to an embodiment of the present disclosure. The method for manufacturing an array substrate is used to manufacture the array substrate shown in FIG. 3. The method may include the following steps.

In step 1001, a display area and a lead area are defined on a side of a flexible base.

In step 1002, a TFT is formed in the display area on a side of the flexible base.

In step 1003, a connecting line is formed in the lead area on a side of the flexible base, the connecting line is used to electrically connect the TFT to a drive circuit, and a manufacturing material of the connecting line includes a flexible conductive material.

In summary, in the method for manufacturing an array substrate according to an embodiment of the present disclosure, a TFT is formed on a display area of the flexible base, a connecting line electrically connected to the TFT is formed in a lead area of the flexible base, and a manufacturing material of the connecting line includes a flexible conductive material. Since the flexible conductive material has electrical conductivity and is not easily broken, the connecting line is not easily broken when the array substrate is bent. Compared with the related art, the breaking probability of the connecting line is reduced, which effectively improves the yield of the display device. Moreover, when the connecting line is bent a plurality of times, since the resistivity of the flexible conductive material is not affected, the resistivity of the connecting line will not be affected either, which may further improve the yield of the display device.

Figure 11:
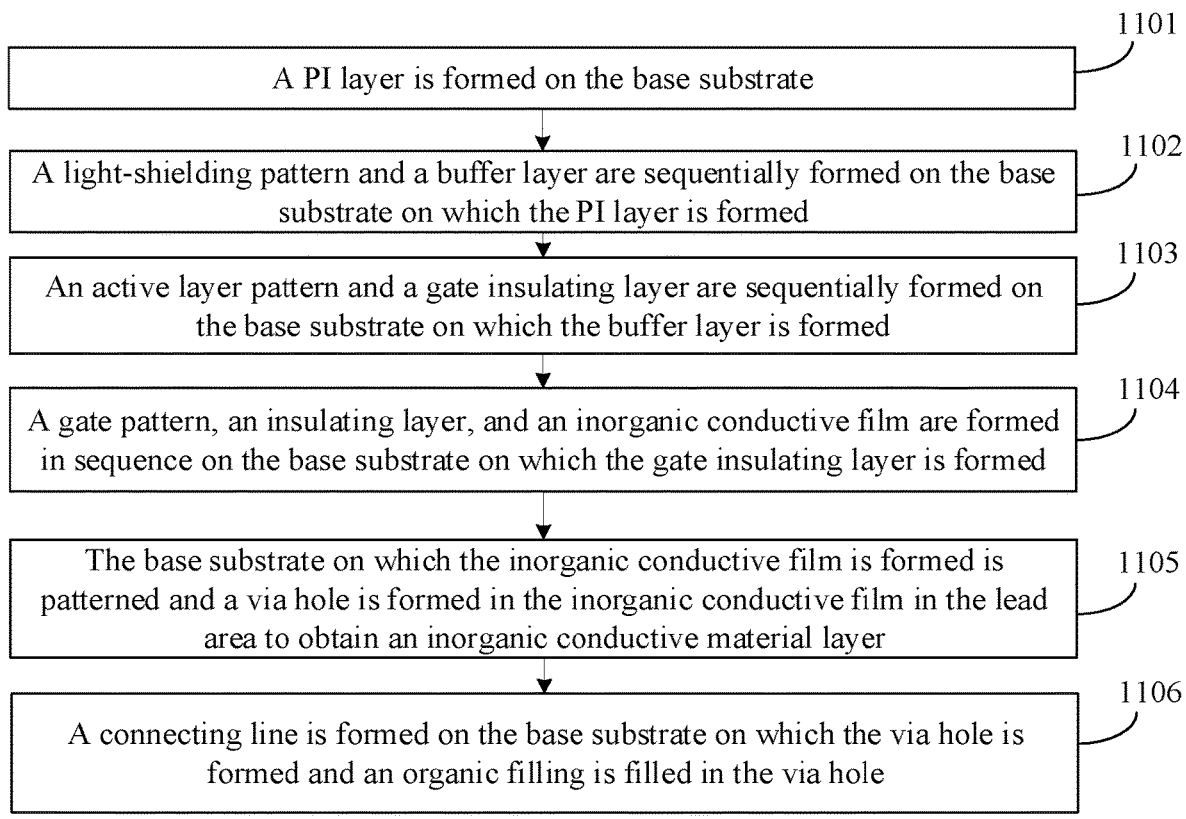
FIG. 11 is a flowchart of another method for manufacturing an array substrate according to an embodiment of the present disclosure.

FIG. 11 is a flowchart of another method for manufacturing an array substrate according to an embodiment of the present disclosure. The method for manufacturing an array substrate is used to manufacture the array substrate shown in FIG. 4 or FIG. 5. Since the array substrate is usually manufactured on a base substrate, the method will be described below by taking manufacturing an array substrate on a base substrate as an example. Please refer to FIG. 11. The method may include the following steps.

In step 1101, a PI layer is formed on the base substrate.

Exemplarily, the PI layer may be formed on the base substrate in any of a plurality of ways such as deposition, coating, sputtering, and the like. The PI layer is a flexible base.

In step 1102, a light-shielding pattern and a buffer layer are sequentially formed on the base substrate on which the PI layer is formed.

Optionally, the material of the light-shielding pattern may be a metal material or a non-metal material having a light-shielding property. The buffer layer may include a silicon nitride film and a silicon oxide film which are sequentially stacked.

Exemplarily, a light-shielding film may be formed on the base substrate on which a PI layer is formed in any of various ways such as deposition, coating, sputtering, and the like, and then a one-time patterning process is performed on the light-shielding film to form a light-shielding pattern. The one-time patterning process may include: photoresist coating, exposure, development, etching, and photoresist stripping. Further, the buffer layer is formed on the flexible base on which a light-shielding pattern is formed in any of various ways such as deposition, coating, sputtering, and the like.

In step 1103, an active layer pattern and a gate insulating layer are sequentially formed on the base substrate on which the buffer layer is formed.

Optionally, the material of the active layer pattern may be an inorganic material. For example, it may be polysilicon, indium gallium zinc oxide (IGZO), indium tin oxide (ITO) or indium-doped zinc oxide (IZO). The material of the gate insulating layer may be silicon dioxide, silicon nitride, a high dielectric constant material or the like.

Exemplarily, an active layer thin film may be formed on the base substrate on which a buffer layer is formed in any of various ways such as deposition, coating, sputtering, and the like, and then a one-time patterning process is performed on the active layer thin film to form the active layer pattern. Further, the gate insulating layer is formed on the base substrate on which the active layer pattern is formed in any of various ways such as deposition, coating, sputtering, and the like.

In step 1104, a gate pattern, an insulating layer, and an inorganic conductive film are formed in sequence on the base substrate on which the gate insulating layer is formed.

Optionally, the materials of the gate pattern and the inorganic conductive film may be metal molybdenum (Mo), metal titanium (Ti), metal copper (Cu), metal aluminum (Al) or alloy material. In an optional implementation, the inorganic conductive film may be a Ti film, an Al film and a Ti film which are sequentially stacked. The insulating layer may be an interlayer dielectric layer. The material of the insulating layer may be silicon dioxide, silicon nitride, a high dielectric constant material or the like.

Exemplarily, a gate film may be formed on the base substrate on which a gate insulating layer is formed in any of various ways such as deposition, coating, sputtering, and the like, and then a one-time patterning process is performed on the gate film to form a gate pattern. An insulating layer is then formed on the base substrate on which the gate pattern is formed in any of various ways such as deposition, coating, sputtering, and the like. An inorganic conductive film is formed on the base substrate on which the insulating layer is formed in any of various ways such as deposition, coating, sputtering, and the like.

In step 1105, the base substrate on which the inorganic conductive film is formed is patterned and a via hole is formed in the inorganic conductive film in the lead area to obtain an inorganic conductive material layer.

In the embodiments of the present disclosure, the via hole needs to sequentially pass through the inorganic conductive material layer, the insulating layer, and the buffer layer.

In step 1106, a connecting line is formed on the base substrate on which the via hole is formed and an organic filling is filled in the via hole.

Optionally, the manufacturing material of the connecting line may include a flexible conductive material. Exemplarily, the flexible conductive material is a carbon nanotube material or a flexible metal material. Alternatively, the flexible conductive material may be a carbon nanotube material doped with a metal material. The material of the organic filling may be an organic material such as an acrylic resin or an epoxy resin.

In the embodiment of the present disclosure, there are various ways of forming a connecting line on the base substrate on which the via hole is formed and filling an organic filling in the via hole. The embodiments of the present disclosure are schematically described by taking the following two implementations as examples.

In the first implementation, the step 1006 may include the following steps.

In step A1, a connecting line is formed on the base substrate on which the via hole is formed.

In step B1, the via hole in the base substrate on which the connecting line is formed is filled with an organic filling.

In a second implementation, the step 1006 may include the following steps.

In step A2, the via hole is filled with an organic filling.

In step B2, a connecting line is formed on the base substrate in which the via hole is filled with the organic filling.

In the foregoing first implementation and the second implementation, the manner of forming the connecting line may include the following steps.

In step A3, a carbon nanotube film is formed on the base substrate on which the via hole is formed.

Exemplarily, a carbon nanotube film can be formed by a solution process on the base substrate on which a via hole is formed using a carbon nanotube solution. Optionally, the carbon nanotube film may be doped with a metal material, such that the carbon nanotube solution is a carbon nanotube solution having a high content of metal elements.

In step B3, the base substrate on which the carbon nanotube film is formed is baked.

Exemplarily, after the carbon nanotube film is formed on the base substrate on which the via hole is formed, the base substrate may be baked for a period of time so that the carbon nanotube film is bonded to the previously formed inorganic conductive material layer.

In step C3, the carbon nanotube film after baking is patterned to form a connecting line and a source-drain pattern of the TFT.

In the embodiment of the present disclosure, the connecting line in the lead area and the source-drain pattern in the TFT are formed in a one patterning process. The materials of the connecting line and the source-drain pattern in the TFT both included a carbon nanotube material doped with a metal material.

In the embodiment of the present disclosure, a planarization layer is further to be formed on the base substrate. The material of which the planarization layer is made may be the same as the material of which the organic filling is made. For the first implementation described above, the organic filling and the planarization layer may be simultaneously formed. For the second implementation, the planarization layer may be formed on the base substrate on which the connecting line is formed.

It should be noted that the working principle of the array substrate can be referred to the foregoing description of the structure of the array substrate, which will not be described in the embodiment of the present disclosure.

In summary, in the method for manufacturing an array substrate according to an embodiment of the present disclosure, a TFT is formed on a display area of the flexible base, a connecting line electrically connected to the TFT is formed in a lead area of the flexible base, and a manufacturing material of the connecting line includes a flexible conductive material. Since the flexible conductive material has electrical conductivity and is not easily broken, the connecting line is not easily broken when the array substrate is bent. Compared with the related art, the breaking probability of the connecting line is reduced, which effectively improves the yield of the display device. Moreover, when the connecting line is bent a plurality of times, since the resistivity of the flexible conductive material is not affected, the resistivity of the connecting line will not be affected either, and which may further improve the yield of the display device.

The embodiment of the present disclosure further provides a display substrate including the array substrate in the above embodiment. The array substrate may be the array substrate shown in FIG. 3, FIG. 4 or FIG. The display substrate may be any product or component having a display function such as an electronic paper, a mobile phone, a tablet computer, a television, a display, a notebook computer, a digital photo frame, a navigator and the like.

Optionally, the display substrate may further include: a first electrode layer, a pixel defining layer, an organic light-emitting layer, and a second electrode layer, which are sequentially stacked on the TFT. One of a source and a drain of the TFT is connected to the first electrode layer.

The embodiment of the present disclosure also provides a display device including the display substrate in the above embodiment. For example, the display device may be a low-temperature polysilicon active matrix organic light-emitting diode display (LTPS-AMOLED).

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. An array substrate, comprising: a flexible base, and, a thin film transistor (TFT) and a connecting line which are on a side of the flexible base, wherein
the array substrate has a display area and a lead area, the TFT is in the display area, the connecting line is in the lead area, the connecting line is used to electrically connect the TFT to a drive circuit, and a manufacturing material of the connecting line comprises a flexible conductive material;
wherein an inorganic material layer has at least one via hole column in the lead area, each of the at least one via hole column comprises a plurality of via holes, and an arrangement direction of the via holes in each of the at least one via hole column is parallel to a bending line which appears when the array substrate is bent; and
the plurality of via holes in each via hole column are directly connected to each other; and
wherein an orthographic projection of the connecting line on the flexible base covers orthographic projections of at least two via holes of a via hole column on the flexible base.

2. The array substrate of claim 1, wherein the flexible conductive material is one of a carbon nanotube material and a carbon nanotube material doped with a metal material.

3. The array substrate of claim 1, further comprising: an inorganic conductive material layer, wherein the connecting line is on a side of the inorganic conductive material layer away from the flexible base.

4. The array substrate of claim 1, wherein the array substrate is configured to be capable of being bent where the via hole is.

5. The array substrate of claim 4, wherein the via hole has a shape of one of elliptical, hexagonal, and diamond.

6. The array substrate of claim 4, further comprising: an inorganic conductive material layer, wherein the connecting line is on a side of the inorganic conductive material layer away from the flexible base, and the inorganic material layer comprises the inorganic conductive material layer.

7. The array substrate of claim 4, wherein the via hole is filled with an organic filling.

8. The array substrate of claim 7, wherein the connecting line is on a side of the organic filling away from the flexible base.

9. The array substrate of claim 7, further comprising: an inorganic conductive material layer, wherein the inorganic material layer comprises the inorganic conductive material layer, and the connecting line is between the organic filling and the inorganic conductive material layer.

10. The array substrate of claim 1, wherein when the array substrate is in a bent state, the connecting line is outside a bent portion of the flexible base, and the drive circuit and the TFT are respectively on opposite sides of the flexible base which is in a bent state.

11. A method for manufacturing an array substrate, comprising:
defining a display area and a lead area on a side of a flexible base;
forming a thin film transistor (TFT) in the display area on the side of the flexible base; and
forming a connecting line in the lead area on the side of the flexible base, wherein the connecting line is used to electrically connect the TFT to a drive circuit, and a manufacturing material of the connecting line comprises a flexible conductive material; and
wherein an inorganic material layer has at least one via hole column in the lead area, each of the at least one via hole column comprises a plurality of via holes, and an arrangement direction of the via holes in each of the at least one via hole column is parallel to a bending line which appears when the array substrate is bent; and
the plurality of via holes in each via hole column are directly connected to each other; and
wherein an orthographic projection of the connecting line on the flexible base covers orthographic projections of at least two via holes of a via hole column on the flexible base.

12. The method of claim 11, wherein before forming the connecting line in the lead area on the side of the flexible base, the method further comprises:
- forming an inorganic conductive material layer on the flexible base, wherein the inorganic conductive material layer has a via hole in the lead area, an overlap exists between an orthographic projection of the connecting line on the flexible base and an orthographic projection of the via hole on the flexible base, and the array substrate is configured to be capable of being bent where the via hole is;
- forming the connecting line in the lead area on the side of the flexible base comprises:
- forming the connecting line on the flexible base on which the inorganic conductive material layer is formed; and
- after forming the connecting line in the lead area on the side of the flexible base, the method further comprises:
- filling an organic filling in the via hole on the flexible base on which the connecting line is formed.

13. The method of claim 11, wherein before forming the connecting line in the lead area on the side of the flexible base, the method further comprises:
- forming an inorganic conductive material layer on the flexible base, wherein the inorganic conductive material layer has a via hole in the lead area, an overlap exists between an orthographic projection of the connecting line on the flexible base and an orthographic projection of the via hole on the flexible base, and the array substrate is used to be capable of being bent where the via hole is; and
- filling the via hole with an organic filling; and
- forming the connecting line in the lead area on the side of the flexible base comprises:
- forming the connecting line on a side of the organic filling away from the flexible base.

14. The method of claim 11, wherein forming the connecting line in the lead area on the side of the flexible base comprises:
- forming a carbon nanotube film in the lead area on the side of the flexible base;
- baking the flexible base on which the carbon nanotube film is formed; and
- patterning the carbon nanotube film after baking to form the connecting line.

15. A display substrate comprising: an array substrate, a flexible base, and, a thin film transistor (TFT) and a connecting line which are on a side of the flexible base, wherein
- the array substrate has a display area and a lead area, the TFT is in the display area, the connecting line is in the lead area, the connecting line is used to electrically connect the TFT to a drive circuit, and a manufacturing material of the connecting line comprises a flexible conductive material; and
- wherein an inorganic material layer has at least one via hole column in the lead area, each of the at least one via hole column comprises a plurality of via holes, and an arrangement direction of the via holes in each of the at least one via hole column is parallel to a bending line which appears when the array substrate is bent; and
- the plurality of via holes in each via hole column are directly connected to each other; and
- wherein an orthographic projection of the connecting line on the flexible base covers orthographic projections of at least two via holes of a via hole column on the flexible base.

16. A display device comprising a display substrate of claim 15.

* * * * *